United States Patent
Seo et al.

(10) Patent No.: US 10,192,855 B2
(45) Date of Patent: Jan. 29, 2019

(54) SEMICONDUCTOR PACKAGE AND ELECTRONIC DEVICE HAVING HEAT DISSIPATION PATTERN AND/OR HEAT CONDUCTING LINE

(71) Applicants: Sunkyoung Seo, Suwon-si (KR); Chajea Jo, Incheon (KR); Ji Hwang Kim, Cheonan-si (KR); Taeje Cho, Yongin-si (KR)

(72) Inventors: Sunkyoung Seo, Suwon-si (KR); Chajea Jo, Incheon (KR); Ji Hwang Kim, Cheonan-si (KR); Taeje Cho, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 35 days.

(21) Appl. No.: 14/841,736

(22) Filed: Sep. 1, 2015

(65) Prior Publication Data

US 2016/0133613 A1 May 12, 2016

(30) Foreign Application Priority Data

Nov. 10, 2014 (KR) .................. 10-2014-0155554

(51) Int. Cl.
*H01L 23/02* (2006.01)
*H01L 23/48* (2006.01)
(Continued)

(52) U.S. Cl.
CPC ............ *H01L 25/105* (2013.01); *H01L 23/13* (2013.01); *H01L 23/36* (2013.01);
(Continued)

(58) Field of Classification Search
CPC ....... H01L 25/105; H01L 23/36; H01L 23/13; H01L 23/49816; H01L 23/481;
(Continued)

(56) References Cited

U.S. PATENT DOCUMENTS 6,265,772 B1  7/2001  Yoshida
6,271,056 B1  8/2001  Farnworth et al.
(Continued)

FOREIGN PATENT DOCUMENTS

JP    08-017975    1/1996
JP    2001-085603  3/2001
(Continued)

*Primary Examiner* — Kimberly Rizkallah
*Assistant Examiner* — Dilinh Nguyen
(74) *Attorney, Agent, or Firm* — Muir Patent Law, PLLC

(57) ABSTRACT

A semiconductor package is provided. The semiconductor package include a lower semiconductor package including a lower package substrate and a lower semiconductor chip mounted thereon, and an upper semiconductor package provided on the lower semiconductor package to include an upper package substrate and an upper semiconductor chip mounted thereon. The upper package substrate include an upper heat-dissipation pattern, the lower semiconductor chip include a first via connected to the upper heat-dissipation pattern through the lower semiconductor chip, and the first via may provide a pathway for dissipating heat generated in the lower semiconductor chip.

20 Claims, 9 Drawing Sheets

(51) Int. Cl.
*H01L 23/52* (2006.01)
*H01L 29/40* (2006.01)
*H01L 25/10* (2006.01)
*H01L 23/367* (2006.01)
*H01L 23/13* (2006.01)
*H01L 23/36* (2006.01)
*H01L 23/498* (2006.01)
H01L 23/31 (2006.01)
H01L 23/00 (2006.01)
H01L 25/18 (2006.01)

(52) U.S. Cl.
CPC ........ *H01L 23/3677* (2013.01); *H01L 23/481* (2013.01); *H01L 23/49816* (2013.01); H01L 23/3128 (2013.01); H01L 24/05 (2013.01); H01L 24/13 (2013.01); H01L 24/14 (2013.01); H01L 24/17 (2013.01); H01L 24/32 (2013.01); H01L 24/48 (2013.01); H01L 24/73 (2013.01); H01L 25/18 (2013.01); H01L 2224/0401 (2013.01); H01L 2224/04042 (2013.01); H01L 2224/0557 (2013.01); H01L 2224/131 (2013.01); H01L 2224/13025 (2013.01); H01L 2224/13111 (2013.01); H01L 2224/13113 (2013.01); H01L 2224/13116 (2013.01); H01L 2224/13139 (2013.01); H01L 2224/13147 (2013.01); H01L 2224/14181 (2013.01); H01L 2224/14519 (2013.01); H01L 2224/16225 (2013.01); H01L 2224/16227 (2013.01); H01L 2224/16235 (2013.01); H01L 2224/17181 (2013.01); H01L 2224/32145 (2013.01); H01L 2224/32225 (2013.01); H01L 2224/48091 (2013.01); H01L 2224/48227 (2013.01); H01L 2224/73265 (2013.01); H01L 2225/0651 (2013.01); H01L 2225/06568 (2013.01); H01L 2225/1023 (2013.01); H01L 2225/1058 (2013.01); H01L 2225/1076 (2013.01); H01L 2225/1094 (2013.01); H01L 2924/00014 (2013.01); H01L 2924/1431 (2013.01); H01L 2924/1434 (2013.01); H01L 2924/15159 (2013.01); H01L 2924/15192 (2013.01); H01L 2924/15311 (2013.01); H01L 2924/15331 (2013.01); H01L 2924/181 (2013.01); H01L 2924/18161 (2013.01)

(58) Field of Classification Search
CPC ....... H01L 23/3677; H01L 2224/16225; H01L 2924/181; H01L 2224/0557; H01L 24/32; H01L 2224/16227; H01L 2224/48091; H01L 2224/131; H01L 24/14; H01L 2224/32145; H01L 2224/13147; H01L 2924/15331; H01L 2224/32225; H01L 24/13; H01L 2924/18161; H01L 24/48; H01L 2224/13139; H01L 2924/15159; H01L 2224/13116; H01L 24/73; H01L 24/17; H01L 2225/1058; H01L 2225/06568; H01L 2224/48227; H01L 2224/73265; H01L 24/05; H01L 2924/15192; H01L 2225/0651; H01L 2924/15311; H01L 2225/1023; H01L 2224/04042
USPC ................ 257/685, 686, 723, 777, 778, 774
See application file for complete search history.

(56) References Cited

U.S. PATENT DOCUMENTS

| | | | |
|---|---|---|---|
| 6,282,094 | B1 | 8/2001 | Lo et al. |
| 6,388,333 | B1 | 5/2002 | Taniguchi et al. |
| 6,455,928 | B2 | 9/2002 | Corisis et al. |
| 6,479,321 | B2 | 11/2002 | Wang et al. |
| 6,977,440 | B2 | 12/2005 | Pflughaupt et al. |
| 7,408,255 | B2 | 8/2008 | Corisis et al. |
| 7,550,835 | B2 | 6/2009 | Kang |
| 7,872,869 | B2 | 1/2011 | Lee et al. |
| 7,894,203 | B2 | 2/2011 | Kariya et al. |
| 8,159,066 | B2 | 4/2012 | Yang |
| 8,264,846 | B2 * | 9/2012 | Jones .................... H01L 25/165 361/760 |
| 8,284,401 | B2 * | 10/2012 | Choi ......................... G01J 3/02 356/419 |
| 8,462,511 | B2 | 6/2013 | Lee |
| 8,710,634 | B2 * | 4/2014 | Chi ..................... H01L 23/3128 257/659 |
| 2003/0174478 | A1 | 9/2003 | Oggioni et al. |
| 2003/0197260 | A1 | 10/2003 | Nishimura et al. |
| 2005/0199992 | A1 | 9/2005 | Baek et al. |
| 2005/0199993 | A1 | 9/2005 | Lee et al. |
| 2006/0006517 | A1 | 1/2006 | Lee et al. |
| 2006/0118934 | A1 | 6/2006 | Ishikawa et al. |
| 2008/0258293 | A1 | 10/2008 | Yang et al. |
| 2012/0282735 | A1 * | 11/2012 | Ahn ................... H01L 21/76898 438/109 |
| 2014/0346667 | A1 * | 11/2014 | Han .................... H01L 23/3128 257/737 |

FOREIGN PATENT DOCUMENTS

| | | |
|---|---|---|
| JP | 2002-176135 | 6/2002 |
| KR | 10-1999-0069447 | 9/1999 |
| KR | 2005-0090882 | 9/2005 |
| KR | 2006-0080420 | 7/2006 |

* cited by examiner

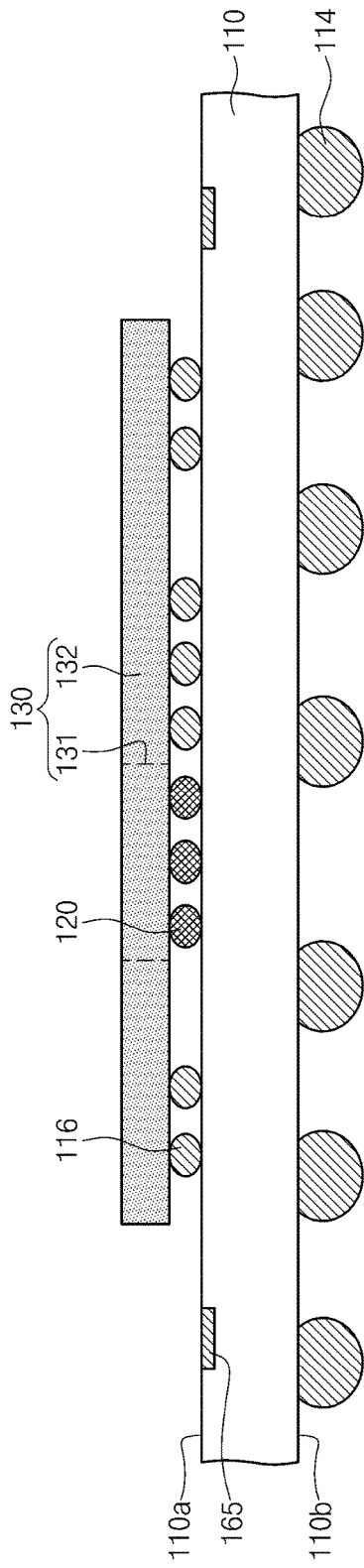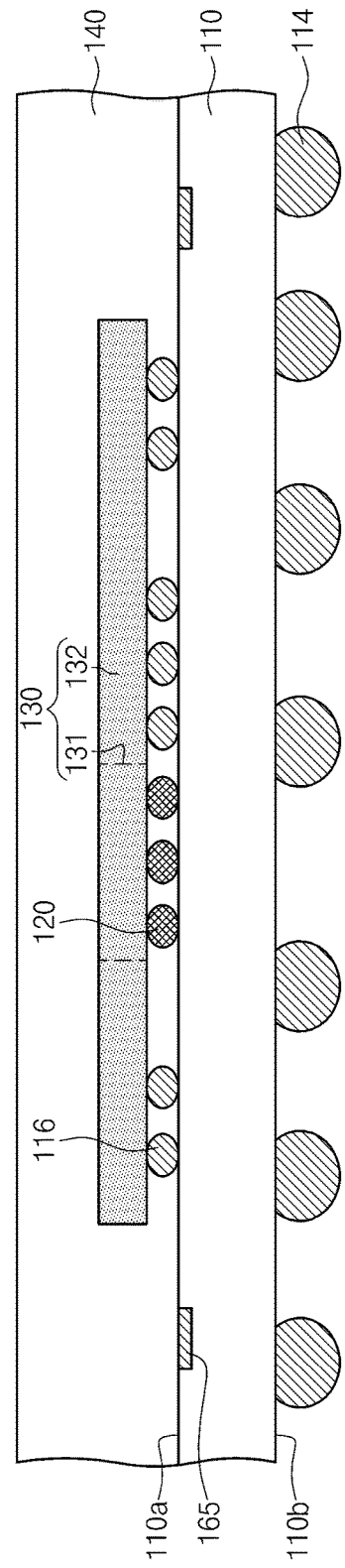

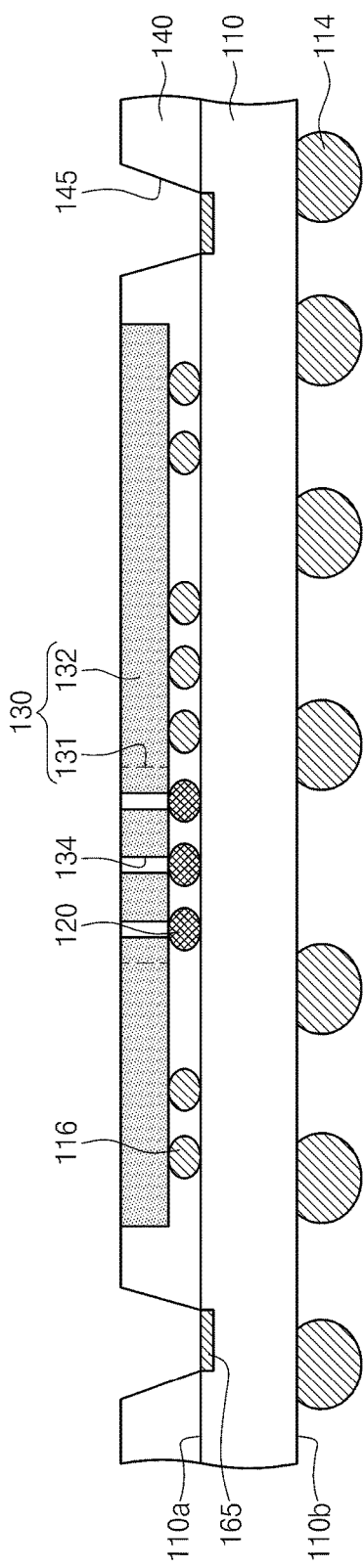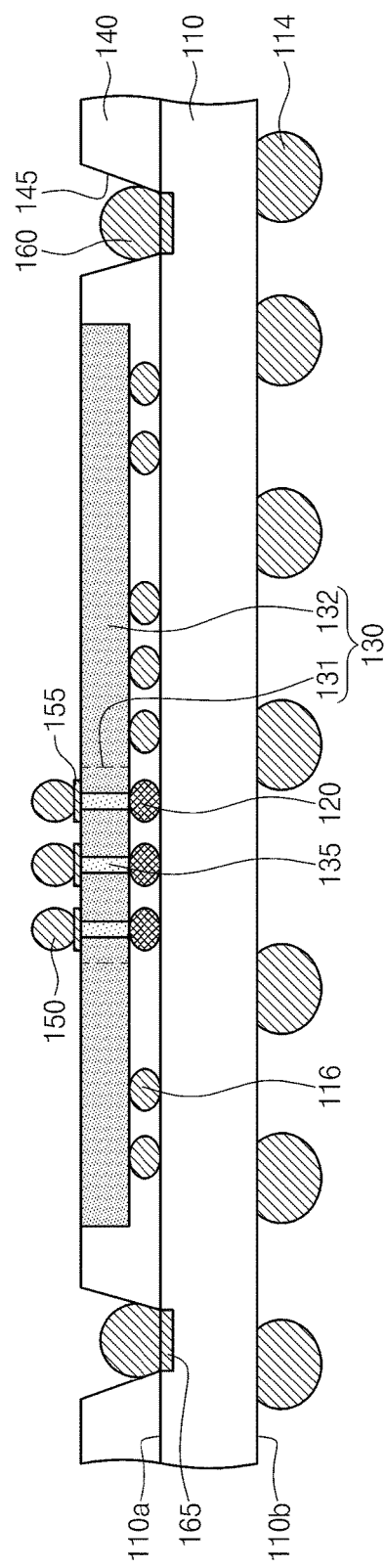

SEMICONDUCTOR PACKAGE AND ELECTRONIC DEVICE HAVING HEAT DISSIPATION PATTERN AND/OR HEAT CONDUCTING LINE

CROSS-REFERENCE TO RELATED APPLICATIONS

This U.S. non-provisional patent application claims priority under 35 U.S.C. § 119 to Korean Patent Application No. 10-2014-0155554, filed on Nov. 10, 2014, in the Korean Intellectual Property Office, the entire contents of which are hereby incorporated by reference.

BACKGROUND OF THE INVENTION

The present disclosure relates to a semiconductor package, and in particular, to a package-on-package type semiconductor package and a method of fabricating the same.

High-performance, high-speed and compact electronic systems are seeing increasing demand as the electronic industry matures. Various semiconductor package techniques have been proposed to meet such a demand. For example, a semiconductor package device may be configured to include a plurality of semiconductor chips mounted on a package substrate or to have a package-on-package (PoP) structure. Since each package of the PoP device has a semiconductor chip and a package substrate, the PoP device may have a large thickness causing various technical problems. In addition, for the PoP device, it is difficult to exhaust heat generated in semiconductor chips to the outside, and thus, the PoP device often suffers from technical problems, such as a device malfunction or a reduction in operation speed.

SUMMARY

Example embodiments of the inventive concept provide a semiconductor package configured to effectively exhaust heat energy from a semiconductor chip.

According to example embodiments of the inventive concept, a semiconductor package may include a lower semiconductor package including a lower package substrate and a lower semiconductor chip mounted thereon, and an upper semiconductor package provided on the lower semiconductor package to include an upper package substrate and an upper semiconductor chip mounted thereon. The upper package substrate may include an upper heat-dissipation pattern, the lower semiconductor chip may include a first via connected to the upper heat-dissipation pattern through the lower semiconductor chip, and the first via may provide a pathway for dissipating heat generated in the lower semiconductor chip.

In example embodiments, the semiconductor package may further include a first connecting portion provided between the upper package substrate and the lower semiconductor chip to connect the first via to the upper heat-dissipation pattern.

In example embodiments, the upper package substrate may have a bottom surface facing the lower package substrate and a top surface opposite to the bottom surface, and the semiconductor package further includes a metal pattern provided on the bottom surface of the upper package substrate to connect the upper heat-dissipation pattern to the first connecting portion.

In example embodiments, the upper package substrate may be provided to have a recessed region recessed toward the top surface.

In example embodiments, the semiconductor package may further include a first heat-dissipation pad provided on the upper package substrate. The upper heat-dissipation pattern may be connected to the first heat-dissipation pad.

In example embodiments, a semiconductor package includes a lower semiconductor package and an upper semiconductor package provided on the lower semiconductor package. The lower semiconductor package includes a lower package substrate and at least a first lower semiconductor chip mounted thereon. The upper semiconductor package includes an upper package substrate and at least a first upper semiconductor chip mounted thereon. The upper package substrate may include an upper heat-dissipation pattern not electrically connected to any circuitry for transmitting signals to, from, or through the upper package substrate, and the first lower semiconductor chip may include at least a first lower heat-conducting via connected to the upper heat-dissipation pattern through the first lower semiconductor chip, the first lower heat-conducting via providing a pathway for dissipating heat generated in the first lower semiconductor chip.

In certain embodiments, the first lower heat-conducting via is formed of a metal and is not electrically connected to any circuitry for transmitting signals to, from, or within the first lower semiconductor chip.

In certain embodiments, the semiconductor package further includes a first heat-connecting portion provided between the upper package substrate and the first lower semiconductor chip to connect the first lower heat-conducting via to the upper heat-dissipation pattern.

The upper package substrate may have a bottom surface facing the lower package substrate and a top surface opposite to the bottom surface, and the semiconductor package may further include a metal pattern provided on the bottom surface of the upper package substrate to connect the upper heat-dissipation pattern to the first connecting portion.

According to certain embodiments, the upper package substrate may be provided to have a recessed region recessed toward the top surface.

According to some embodiments, the semiconductor package further includes at least a first heat-dissipation pad provided at an upper surface of the upper package substrate opposite a surface of the upper package substrate facing the first lower semiconductor chip, wherein the upper heat-dissipation pattern is connected to the first heat-dissipation pad.

In certain embodiments, the lower semiconductor chip is a logic chip with a logic portion and a memory portion, and the first lower heat-conducting via and a plurality of additional lower heat-conducting vias are provided in the logic portion of the lower semiconductor chip.

In certain embodiments, the lower package substrate comprises: a top surface facing the upper package substrate and a bottom surface opposite to the top surface; and a heat-conducting line connected to the first lower heat-conducting via, the heat-conducting line passing through the lower package substrate, and not electrically connected to any circuitry for transmitting signals to, from, or through the lower package substrate.

The heat-conducting line may include one of a plurality of heat-conducting vias passing vertically through the lower package substrate or a lower heat-dissipation pattern passing horizontally through the lower package substrate.

In certain embodiments, the semiconductor package further includes at least a first heat-dissipation pad provided at an upper surface of the upper package substrate opposite a surface of the upper package substrate facing the first lower semiconductor chip. The upper heat-dissipation pattern may be connected to the first heat-dissipation pad, and at least a second heat-dissipation pad may be provided at a lower surface of the lower package substrate opposite a surface of the lower package substrate facing the first lower semiconductor chip. In addition, the heat-dissipation line may be connected to the lower heat-dissipation pattern and the lower heat-dissipation pattern is connected to the second heat-dissipation pad.

In certain embodiments, the upper semiconductor package further comprises an upper mold layer covering the upper package substrate and the upper semiconductor chip, and the lower semiconductor package further comprises a lower mold layer covering the lower package substrate and at least a side surface of the lower semiconductor chip.

In some embodiments, the first lower heat-conducting via and the upper heat-dissipation pattern are each formed of a metal.

In certain embodiments, a package-on-package device includes an upper package and a lower package. The upper package includes an upper package substrate and at least a first upper semiconductor chip. The lower package includes a lower package substrate and at least a first lower semiconductor chip, wherein the first lower semiconductor chip is positioned between the upper package substrate and the lower package substrate. At least a first heat-conducting connector connected may be formed between the first lower semiconductor chip and the upper package substrate, wherein the first lower semiconductor chip includes a first heat-conducting line passing therethrough that is thermally connected to the first heat-conducting connector and is not connected to transmit electrical signals to, from, or through the first lower semiconductor chip.

According to certain embodiments, the package-on-package device further includes a second heat-conducting line formed in the upper package substrate and thermally connected to the first heat-conducting connector, the second heat-conducting line configured to transmit heat generated at the first lower semiconductor chip toward an outside of the package-on-package device.

In certain embodiments, the first heat-conducting line comprises a first heat-conducting via vertically passing through the first lower semiconductor chip, and the second heat-conducting line comprises a heat-dissipating pattern horizontally passing through the upper package substrate.

In certain embodiments, the package-on-package device includes a third heat-conducting line formed in the lower package substrate and thermally connected to the first heat-conducting line and configured to transmit heat generated at the first lower semiconductor chip toward an outside of the package-on-package device in a different direction from the second heat-conducting line.

In certain embodiments, the third heat-conducting line includes a second heat-conducting via passing through the lower package substrate, or a heat-dissipating pattern horizontally passing through the lower package substrate.

In certain embodiments, the first heat-conducting line comprises a first heat-conducting via passing through a logic portion of the first lower semiconductor chip.

In certain embodiments, the first heat-conducting line and the second heat-conducting line may each be formed of a metal.

According to certain embodiments, an electronic device is provided and includes an upper package including an upper package substrate and at least a first upper semiconductor chip, and a lower package including a lower package substrate and at least a first lower semiconductor chip. The first lower semiconductor chip is positioned between the upper package substrate and the lower package substrate. The first lower semiconductor chip may include a first heat-conducting line passing therethrough and including a metal. The first heat-conducting line is not connected to transmit electrical signals to, from, or through the first lower semiconductor chip. The electronic device further includes a thermal pathway passing through the upper package substrate and thermally connected to the first heat-conducting line, and configured to transmit heat generated at the first lower semiconductor chip toward an outside of the upper package.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 2A through 2E are sectional views illustrating a process of fabricating a semiconductor package according to exemplary embodiments of the inventive concept.

Figure 1:
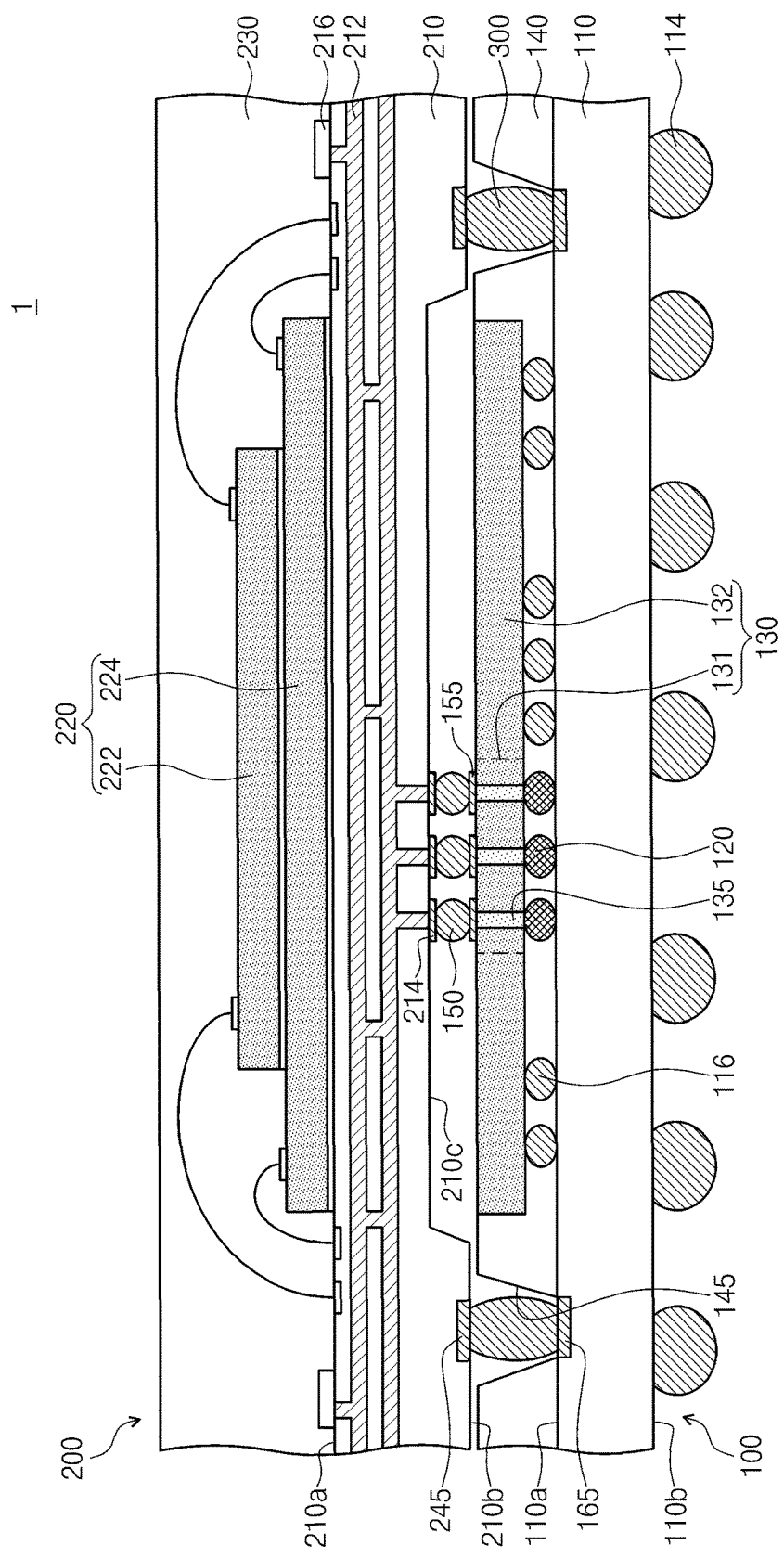
FIG. 1 is a sectional view of a semiconductor package according to exemplary embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein. In the drawings, the thicknesses of layers and regions may be exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). However, the term "contact," as used herein refers to direct contact (i.e., touching) unless the context indicates otherwise.

As used herein the term "and/or" includes any and all combinations of one or more of the associated listed items. It will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed in one section of the specification could be termed a second element, component, region, layer or section in a different section of the specification without departing from the teachings of example embodiments. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a sectional view of a semiconductor package according to exemplary embodiments of the inventive concept.

Referring to FIG. 1, a semiconductor package 1 may include a lower semiconductor package 100 and an upper semiconductor package 200, which are electrically connected to each other through a conductive terminal such as a solder bump 300. The lower semiconductor package 100 may include a lower package substrate 110, one or more lower semiconductor chips including at least a first semiconductor chip 130, and a lower mold layer 140. The upper semiconductor package 200 may include an upper package substrate 210, one or more upper semiconductor chips 220, and an upper mold layer 230.

The lower package substrate 110 may be a printed circuit board (PCB) with circuit patterns. The lower package substrate 110 may have a top surface 110a facing the upper package substrate 210 and a bottom surface 110b opposite to the top surface 110a. A first conductive terminal, such as a first solder bump 114 may be provided on the bottom surface 110b of the lower package substrate 110. The lower semiconductor chip 130 may include an integrated circuit formed on a die from a wafer, and may be a logic chip, a memory chip, or a combination thereof. The lower semiconductor chip 130 may be mounted on the top surface 110a of the lower package substrate 110. For example, in certain embodiments, the lower semiconductor chip 130 may include a logic portion 131 and a memory portion 132. A second conductive terminal, such as second solder bump 116 may be disposed between the lower semiconductor chip 130 and the lower package substrate 110. The second solder bump 116 may connect the lower semiconductor chip 130 electrically with the lower package substrate 110, thereby permitting the transmission of voltages and/or signals between the lower semiconductor chip 130 and the lower package substrate 110. A first conductive pad, such as a first solder pad 165 may be provided on the top surface 110a of the lower package substrate 110. The first solder pad 165 may be formed of or include at least one of lead (Pb), tin (Sn), silver (Ag), bismuth (Bi), or copper (Cu), for example. Although single components are described herein with reference to different elements (e.g., solder bump 300, solder bump 116, solder pad 165, etc.), as depicted in the various figures, a plurality of these components may be included.

The lower semiconductor chip 130 may include at least one first via 135 penetrating the lower semiconductor chip 130. The first via 135 may serve as a pathway for dissipating heat generated in the lower semiconductor chip 130. The first via 135 and other particular components described herein, may be referred to as a heat-dissipating via, or a heat-conducting via. As used herein, when the terms "heat-dissipating," "heat-conducting," or other forms thereof are used, they refer to components that are known to assist in heat dissipation or conduction. As an example, various metals, such as copper, or silver, are known to assist in heat dissipation by being good conductors of heat. Various insulators, such as glass, or epoxy, are known to prevent heat dissipation as heat insulators. Therefore, glass, epoxy, and other materials that have similar thermal properties (e.g., similar thermal conductivity) to glass or epoxy should not be considered "heat-dissipating" or "heat-conducting" materials for the purpose of this application. As a more specific example, metals or combinations of metals such as lead (Pb), tin (Sn), silver (Ag), bismuth (Bi), or copper (Cu), or other metals having thermal conductivities having k values in the tens to hundreds range, or polymers having similar thermal conductivities may be considered "heat-dissipating" or "heat-conducting" materials. On the other hand, materials such as glass, epoxy, or various plastics, having thermal conductivities with k values, for example, less than 1 to about 1, or even up to 5, should not be considered as "heat-dissipating" or "heat-conducting" materials, and may be referred to herein as "heat-insulating" materials. The term "thermally connected" as used herein refers to being connected through one or more continuously connected heat-conducting materials.

In certain embodiments, a central processing unit (CPU) may be provided on the logic portion 131 of the lower semiconductor chip 130, and in this case, heat generated in the logic portion 131 may be greater than that in other portions. In example embodiments, the number of the first heat-conducting vias 135 may be greater in the logic portion 131 of the lower semiconductor chip 130 than in other portions. By forming at least one first heat-conducting via 135 in the logic portion 131 of the lower semiconductor chip 130 (these vias are also referred to as lower heat-conducting vias), it is possible to effectively dissipate heat generated in the lower semiconductor chip 130. The first via 135 may extend vertically through the chip and may be formed of or include a plating material (e.g., nickel or copper) or a polymer material with high thermal conductivity. For example, as described above, the thermal conductivity may have a k value at least in the tens. Or in certain embodiments, the thermal conductivity may have a k value of 100 or more.

A first connecting portion 150 may be provided on the top surface of the lower semiconductor chip 130 and may be connected to the first via 135. For example, the first connecting portion 150 may be a heat-connecting portion formed of a heat-conducting material such as solder or a metal. The first connecting portion 150 may be, for example, a solder ball or bump, or a metal pad. In certain embodiments, the first connecting portion 150 may be formed of or include at least one of lead (Pb), tin (Sn), silver (Ag), bismuth (Bi), or copper (Cu). The first connecting portion 150 may connect to the first via 135 through, for example, a conductive pad 155. Conductive pad 155 may be formed, for example, of metal or other heat-conducting material. As such, conductive pad 155 may contact both the via 135 and the connecting portion 150 to form a thermal path between the two. A second connecting portion 120 may be a heat-connecting portion similar to the first heat-connecting portion 150. The second connecting portion 120 may be provided on the bottom surface of the lower semiconductor chip 130 and may be connected to the first via 135. In one embodiment, the second connecting portion 120 may contact the first via 135. For example, the second connecting portion 120 may be a solder ball. The second connecting portion 120 may be formed of or include, for example, at least one of lead (Pb), tin (Sn), silver (Ag), bismuth (Bi), or copper (Cu). The second connecting portion 120 may be connected to the first via 135, which is not used to transmit electrical signals or voltages, thereby allowing heat generated in the lower semiconductor chip 130 to be dissipated. The second connecting portion 120 may be in a ground or floated state.

As discussed herein, a heat-conductive path, or thermal pathway, refers to a connected set of elements that have heat-conducting components that are positioned to transfer heat from one location to another. The various heat-conducting components described above, such as via 135, connecting portion 120, conductive pad 155, etc., may be part of a heat-conductive path, and may be referred to in various combinations or individually as heat-conductive terminals.

The lower mold layer 140 may be provided to cover a sidewall of the lower semiconductor chip 130 and expose the top surface of the lower semiconductor chip 130. The top surface of the lower semiconductor chip 130 may be substantially coplanar with the top surface of the lower mold layer 140. The lower mold layer 140 may include, for example, an insulating polymer material (e.g., an epoxy molding compound (EMC)), which may be a heat-insulating material. The lower mold layer 140 may include a connecting hole 145, and a conductive terminal such as the solder bump 300 may be provided in the connecting hole 145.

The upper package substrate 210 may be a printed circuit board (PCB) with circuit patterns. The upper package substrate 210 may have a bottom surface 210b facing the lower package substrate 110 and a top surface 210a opposite to the bottom surface 210b. The top surface 210a of the upper package substrate 210 may be flat. The bottom surface 210b of the upper package substrate 210 may be formed to have a recessed region 210c recessed toward the top surface 210a. A width of the recessed region 210c may be substantially equal to or greater than that of the lower semiconductor chip 130. As another example, the width of the recessed region 210c may be smaller than that of the lower semiconductor chip 130. The first connecting portion 150 may be provided in the recessed region 210c. Since the first connecting portion 150 is provided in the recessed region 210c, it is possible to reduce a thickness of the semiconductor package 1.

The upper package substrate 210 may include an upper heat-dissipation pattern 212, a conductive pad, such as metal pad 214, a first heat-dissipation pad 216, and a second conductive terminal, such as solder pad 245. Again, though only one of certain of these components is described here, as shown in the drawings, a plurality of each component may be included. The upper heat-dissipation pattern 212 may be embedded in the upper package substrate 210, and may be formed of one or more heat-dissipating materials, such as described previously. In one embodiment, the upper heat-dissipation pattern 212 may extend horizontally across the upper package substrate 210 to cover an area and/or length greater than that of the first or second upper semiconductor chips 222 or 224. For example, it may be formed of one or more layers of heat-conductive material embedded within the upper package substrate 210. Thus, the upper heat-dissipation pattern 212 may be configured to dissipate heat from a center of the package 1 toward sides of the package 1 through one or more horizontally oriented portions. The metal pad 214 may be provided on the bottom surface 210*b* of the upper package substrate 210. The metal pad 214 may be connected to the first via 135 through the first connecting portion 150. The metal pad 214 may be formed of or include, for example, at least one of lead (Pb), tin (Sn), silver (Ag), bismuth (Bi), or copper (Cu). The first heat-dissipation pad 216 may be provided on the top surface 210*a* of the upper package substrate 210. For example, a plurality of first heat-dissipation pads 216 may be provided on both edge regions of the top surface 210*a* of the upper package substrate 210. As another example, the first heat-dissipation pad 216 may be provided on a side surface of the upper package substrate 210. The first heat-dissipation pad 216 may be formed of or include, for example, at least one of lead (Pb), tin (Sn), silver (Ag), bismuth (Bi), or copper (Cu). The upper heat-dissipation pattern 212 may be configured to connect the metal pattern 214 to the first heat-dissipation pad 216 and thereby serve as a thermal pathway for dissipating heat generated in the lower semiconductor chip 130. The second conductive pad, such as solder pad 245 may be provided on the bottom surface 210*b* of the upper package substrate 210. The second solder pad 245 may be formed of or include, for example, at least one of lead (Pb), tin (Sn), silver (Ag), bismuth (Bi), or copper (Cu).

One or more upper semiconductor chips 220 may be mounted on the upper package substrate 210 at the top surface 210*a*. The one or more upper semiconductor chips 220 may include, for example, a first upper semiconductor chip 222 and a second upper semiconductor chip 224 sequentially stacked on the upper package substrate 210. The first upper semiconductor chip 222 and the second upper semiconductor chip 224 may be mounted on the upper package substrate 210 using, for example, a wire bonding process. For example, the one or more upper semiconductor chips 220 may comprise a single memory chip or a stack of memory chips. In exemplary embodiments, the second upper semiconductor chip 224 may be mounted on the first upper semiconductor chip 222 in a flip-chip bonding manner.

The upper mold layer 230 may be formed to cover the upper semiconductor chip 220. For example, the upper mold layer 230 may include an insulating polymer material (e.g., epoxy molding compound (EMC)), which may be a heat-insulating material.

The solder bump 300 may be configured to connect the lower semiconductor package 100 to the upper semiconductor package 200, for example, to electrically connect the two packages. The solder bump 300 may be formed of or include, for example, at least one of lead (Pb), tin (Sn), silver (Ag), bismuth (Bi), or copper (Cu). The solder bump 300 may be electrically connected to the first solder pad 165 and the second solder pad 245.

In the present embodiments, the first via 135, the first connecting portion 150, the first heat-dissipation pad 216, and the upper heat-dissipation pattern 212 may be connected to each other to constitute a thermal pathway dissipating heat generated in the lower semiconductor chip 130. The heat may be dissipated from the lower semiconductor chip, particularly from a logic portion of the lower semiconductor chip, through a plurality of heat-conducting terminals that form a heat-conducting pathway, toward an outside of the package 1 and away from the integrated circuit elements of the lower semiconductor chip 130 and the lower package 100. The upper heat-dissipation pattern 212 may be used as a heat-dissipation path, not a signal-delivering path for delivering electrical signals between circuits provided in the upper semiconductor chip 220. Thus, in certain embodiments, the upper heat-dissipation pattern 212, along with other terminals in the heat-dissipation path connected thereto, are not electrically connected to any circuitry for transmitting signals to, from, or through the lower semiconductor chip 130 or the upper package substrate 210. Since the first connecting portion 150, the upper heat-dissipation pattern 212 and the first heat-dissipation pad 216 are formed of heat-conducting materials, such as metal materials, heat can be easily dissipated.

FIGS. 2A through 2E are sectional views illustrating a process of fabricating a semiconductor package according to exemplary embodiments of the inventive concept.

Referring to FIG. 2A, a plurality of conductive terminals including the first solder bump 114 may be provided on the bottom surface 110*b* of the lower package substrate 110. A plurality of conductive pads including the first solder pad 165 may be provided on the top surface 110*a* of the lower package substrate 110. The lower semiconductor chip 130 may be disposed on the top surface 110*a* of the lower package substrate 110. The lower semiconductor chip 130 may include the logic portion 131, for example including one or more logic circuits, and the memory portion 132, for example including one more memory cell arrays. The lower semiconductor chip 130 may be electrically connected to the lower package substrate 110 using a plurality of conductive terminals including the second solder bump 116, and may be mounted on the lower package substrate 110, for example, in a flip-chip bonding manner, such that its active surface faces the lower package substrate 110. A plurality of heat-conducting terminals including the second connecting portion 120 may be provided between the lower semiconductor chip 130 and the lower package substrate 110. The second connecting portion 120 may be connected to the first via 135, as will be described below.

Referring to FIG. 2B, the lower mold layer 140 may be formed on the lower package substrate 110. The lower mold layer 140 may be formed to cover the lower semiconductor chip 130. Alternatively, the lower mold layer 140 may be formed to expose the top surface of the lower semiconductor chip 130.

Referring to FIG. 2C, a polishing process may be performed on the lower mold layer 140. The polishing process may be performed in such a way that a portion of the lower mold layer 140 is removed to expose the top surface of the lower semiconductor chip 130. Here, the lower semiconductor chip 130 may be partially removed to have a desired thickness. The top surface of the lower semiconductor chip 130 may be substantially coplanar with that of the lower mold layer 140. The connecting hole 145 may be formed in the lower mold layer 140 using, for example, a laser. The connecting hole 145 may be formed spaced apart from the lower semiconductor chip 130. The connecting hole 145 may be formed to expose the top surface of the first solder pad 165. In example embodiments, a plurality of connecting holes 145 may be formed to be symmetric about the lower semiconductor chip 130.

A plurality of via holes including a first via hole 134 may be formed in the lower semiconductor chip 130. The first via hole 134 may be formed to penetrate the lower semiconductor chip 130. The first via hole 134 may be formed, for example, by a laser drilling process, a mechanical drilling process, or a dry etching process. In general, a central processing unit (CPU) may be provided on the logic portion 131 of the lower semiconductor chip 130. Heat generated in the CPU may be greater than that from other portions, and hence, the first via hole 134 may be formed in such a way that a density thereof is higher in the logic portion 131 than in other portions.

Referring to FIG. 2D, the first via 135 may be formed to penetrate the lower semiconductor chip 130 and fill the first via hole 134. The first via 135 may be formed of or include a plating material (e.g., nickel or copper) or a polymer material with high thermal conductivity. For example, in certain embodiments, a plurality of heat-conducting vias 135 may be formed throughout the lower semiconductor chip 130, but a greater density of heat-conducting vias may be formed in the logic portion 131 of the chip than in other portions, such as a memory portion 132. Some or all of these heat-conducting vias may be electrically separate from circuitry of the semiconductor chip 130 that transmits signals to, from, or through the semiconductor chip 130.

The first connecting portion 150 may be formed on the top surface of the lower semiconductor chip 130 to be in contact with the first via 135. The first connecting portion 150 may be, for example, a solder ball. A lower solder bump 160 may be provided in the connecting hole 145. The lower solder bump 160 may be electrically connected to the first solder pad 165. In the case where a plurality of connecting holes 145 are provided, a plurality of lower solder bumps 160 may be provided in the connecting holes 145, respectively. By forming at least one first via 135 in the logic portion 131 of the lower semiconductor chip 130, it is possible to effectively dissipate heat generated in the lower semiconductor chip 130.

Figure 2E:
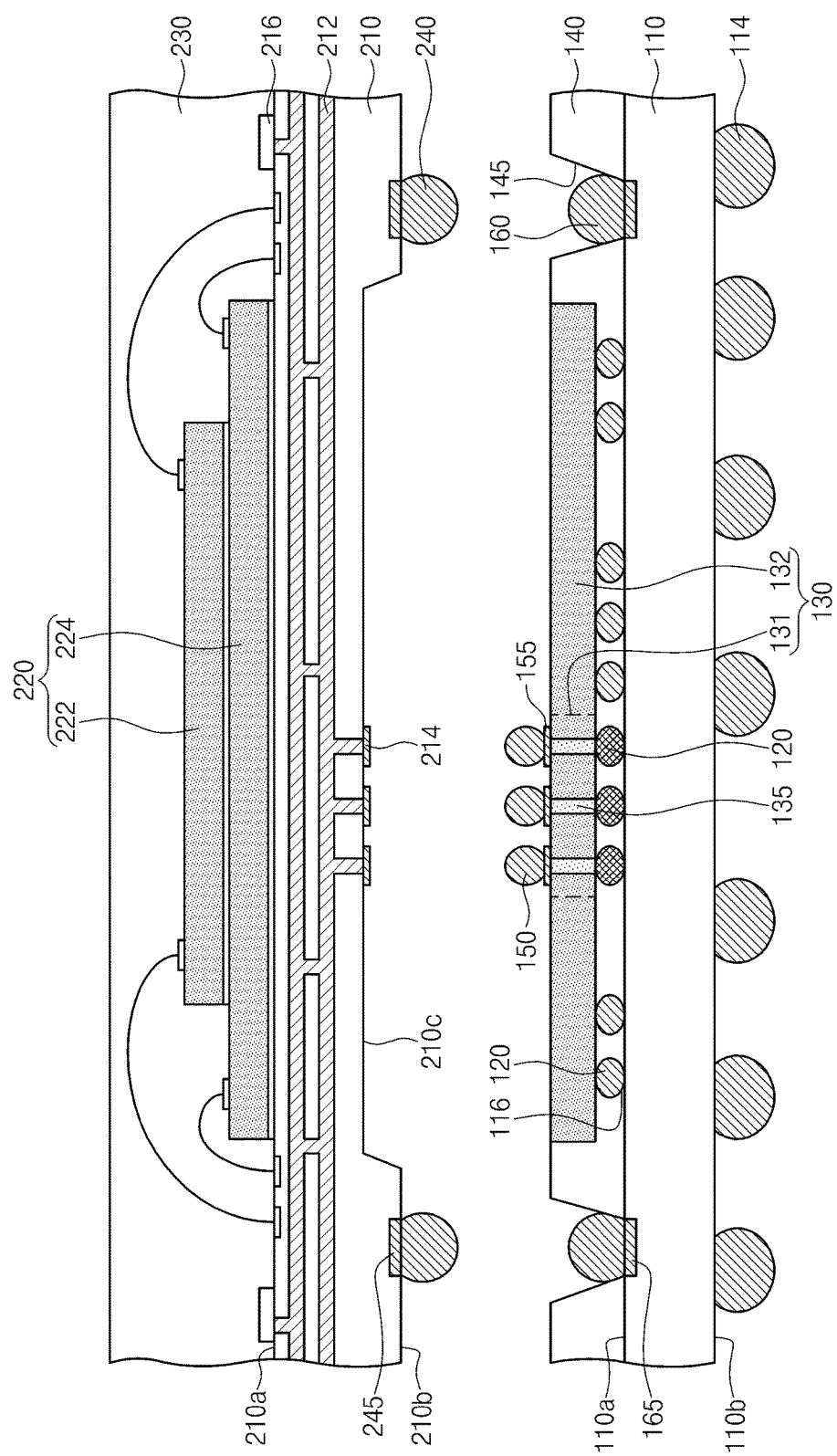

Referring to FIG. 2E, the upper semiconductor package 200 may be formed. The upper semiconductor package 200 may include the upper package substrate 210, the one or more upper semiconductor chips 220, and the upper mold layer 230. For convenience in description, the aforesaid technical features may be omitted below. An upper solder bump 240 may be provided on the bottom surface 210b of the upper package substrate 210. The upper solder bump 240 may be electrically connected to the second solder pad 245. The upper solder bump 240 may be disposed to be overlapped with the connecting hole 145, when viewed in a plan view. The upper semiconductor package 200 may be positioned on the lower semiconductor package 100. The upper solder bump 240 may be inserted into the connecting hole 145.

Referring back to FIG. 1, in one embodiment, a thermo compression bonding process may be performed on the upper semiconductor package 200 to bond the upper solder bump 240 to the lower solder bump 160. As a result of the thermo compression bonding process, the upper solder bump 240 and the lower solder bump 160 may form the solder bump 300. During the thermo compression bonding process, the first connecting portion 150 may be heated and melted to thermally and physically connect the first via 135 to the metal pad 214. Accordingly, the first via 135, the first connecting portion 150, the upper heat-dissipation pattern 212, and the first heat-dissipation pad 216 may be connected to each other to constitute a thermal pathway for dissipating generated heat. In certain embodiments, since a density or the number of the first vias 135 is higher in the logic portion 131 than in other portions, it is possible to more effectively dissipate heat generated in the lower semiconductor chip 130. Since the first connecting portion 150, the upper heat-dissipation pattern 212, and the first heat-dissipation pad 216 are formed of heat-conducting materials, such as metal materials, generated heat can be easily dissipated.

Figure 3:
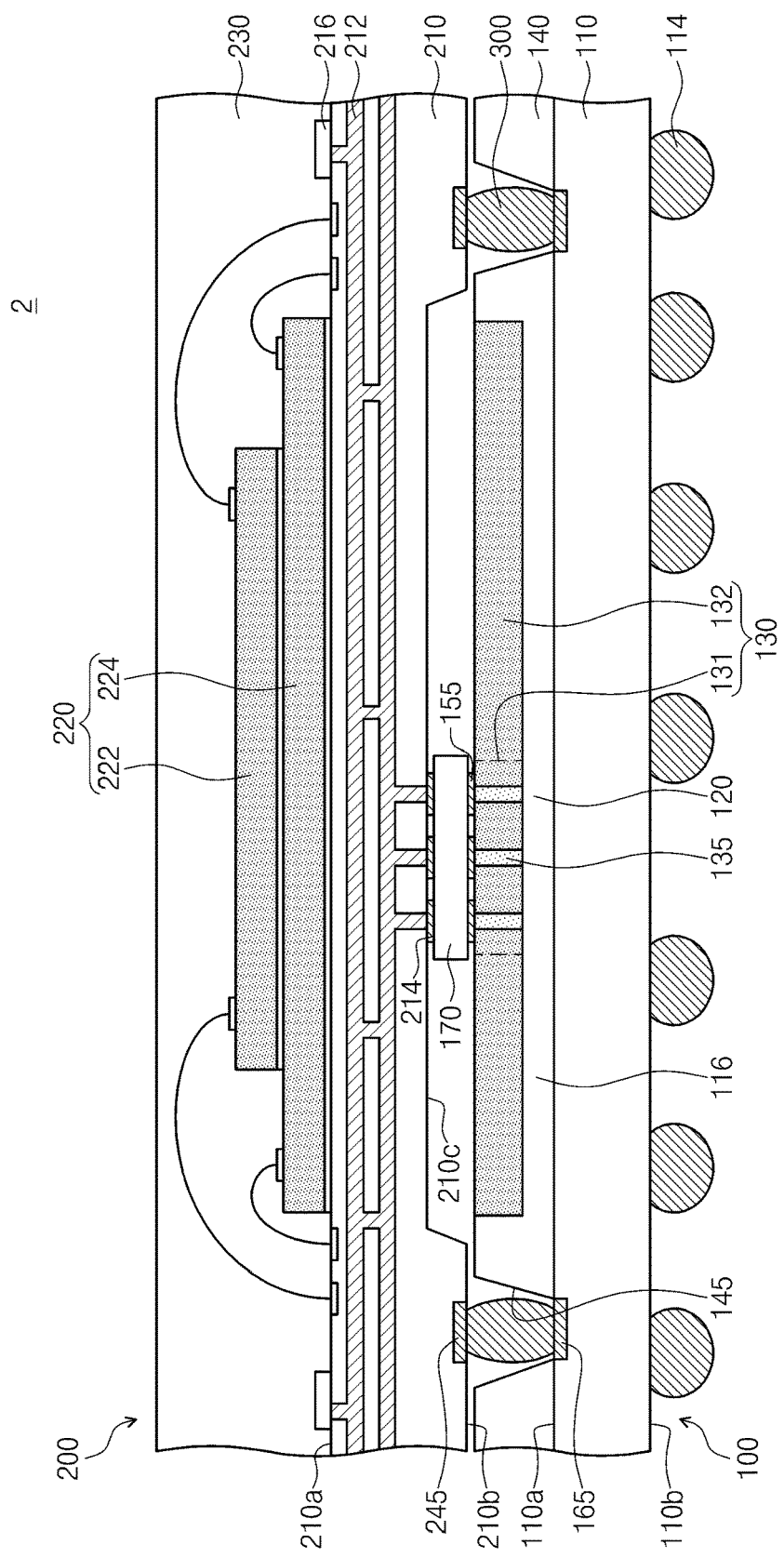
FIG. 3 is a sectional view of a semiconductor package according to certain exemplary embodiments of the inventive concept.

FIG. 3 is a sectional view of a semiconductor package according to other exemplary embodiments of the inventive concept. For convenience in description, the aforesaid technical features may be omitted below.

Referring to FIG. 3, a first connecting portion 170 may be provided in the form of a pad. For example, the first connecting portion 170 may be connected in common to a plurality of the first vias 135. The first connecting portion 170 may be formed of or include a heat-conducting material, including for example at least one of lead (Pb), tin (Sn), silver (Ag), bismuth (Bi), or copper (Cu). During the thermo compression bonding process, the first connecting portion 170 may be heated, and thus, the first via 135 may be physically and thermally connected to the metal pad 214 through the first connecting portion 170. Here, the first via 135, the first connecting portion 170, the upper heat-dissipation pattern 212, and the first heat-dissipation pad 216 may be connected to each other to constitute a thermal pathway of heat-conducting terminals for dissipating generated heat. Since the first via 135, the first connecting portion 170, the upper heat-dissipation pattern 212, and the first heat-dissipation pad 216 are formed of heat-conducting materials such as metal materials, generated heat can be easily dissipated.

Figure 4:
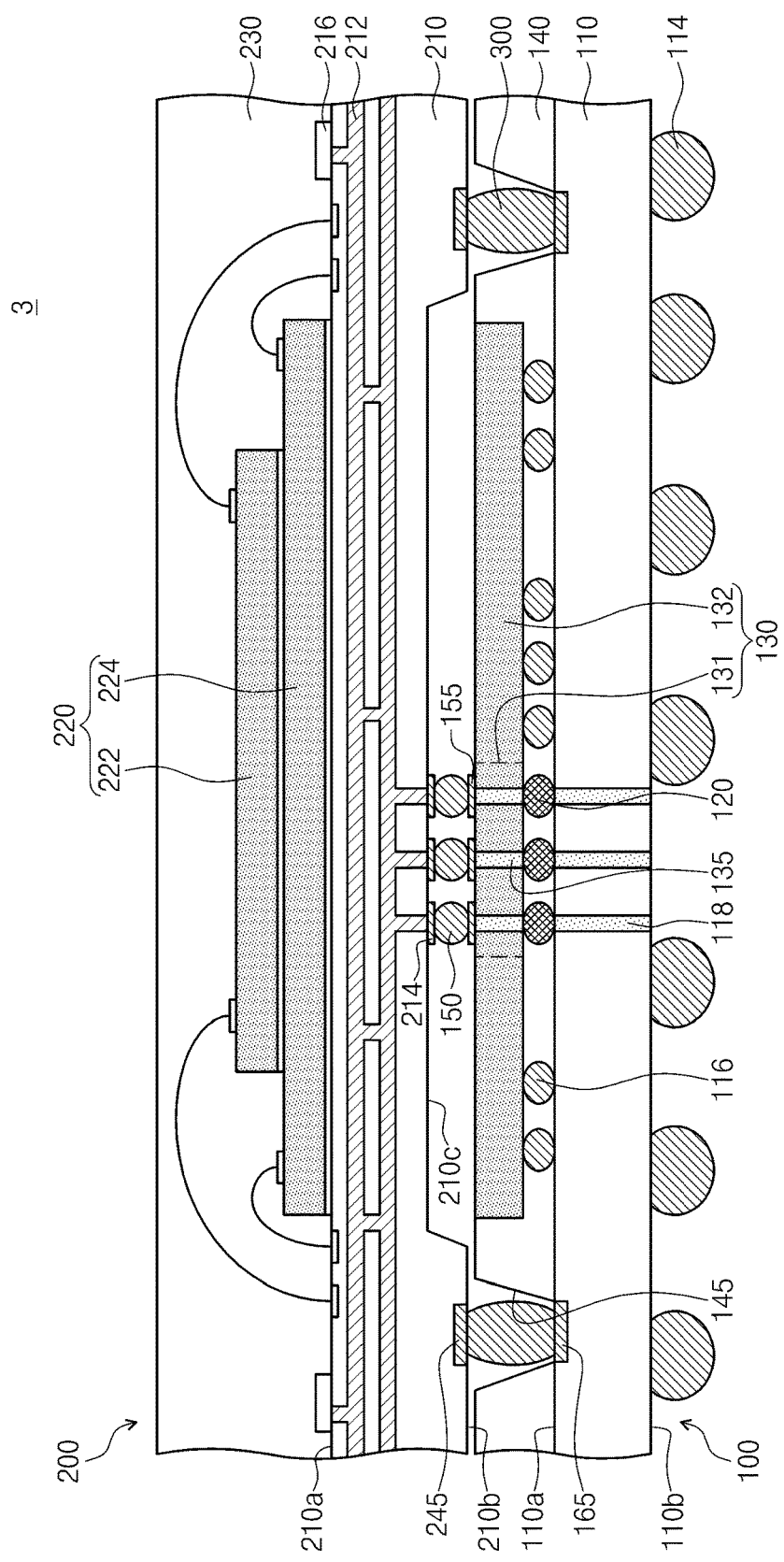
FIG. 4 is a sectional view of another semiconductor package according to certain exemplary embodiments of the inventive concept.

FIG. 4 is a sectional view of a semiconductor package according to still other exemplary embodiments of the inventive concept. For convenience in description, the aforesaid technical features may be omitted below.

Referring to FIG. 4, at least one second heat-conducting via 118 may be formed in the lower package substrate 110. The second via 118 may be provided to penetrate the lower package substrate 110. The second via 118 may pass vertically through the lower package substrate 110 and may be formed of or include a heat-conducting material, for example, a plating material (e.g., nickel or copper) or a polymer material with high thermal conductivity (e.g., having a k value in the tens or hundreds). The second connecting portion 120 which may be a heat-connecting portion, and may be formed of a heat-conducting material, may be provided to connect the first via 135 to the second via 118. The first via 135, the second connecting portion 120, and the second via 118 may dissipate heat generated in the lower semiconductor chip 130 to the outside through the bottom surface 110b of the lower package substrate 110. As such, heat generated in the lower semiconductor chip 130 can be dissipated to the outside through top and bottom surfaces of the lower semiconductor chip 130 in both a downward and upward direction, and this makes it possible to improve a heat dissipation property of the semiconductor package. In this example, in a package-on-package device, heat generated by a semiconductor chip internal to the device may be dissipated through heat-conducting paths in a direction toward a top of the device (e.g., through the upper package substrate 210), at the same time as in a direction toward a bottom of the device (e.g., through the lower package substrate 110). Since the first via 135, the first connecting portion 150, the upper heat-dissipation pattern 212, the first heat-dissipation pad 216, the second connecting portion 120, and the second via 118 are formed of heat-conducting materials, such as metal materials, generated heat can be easily dissipated.

Figure 5:
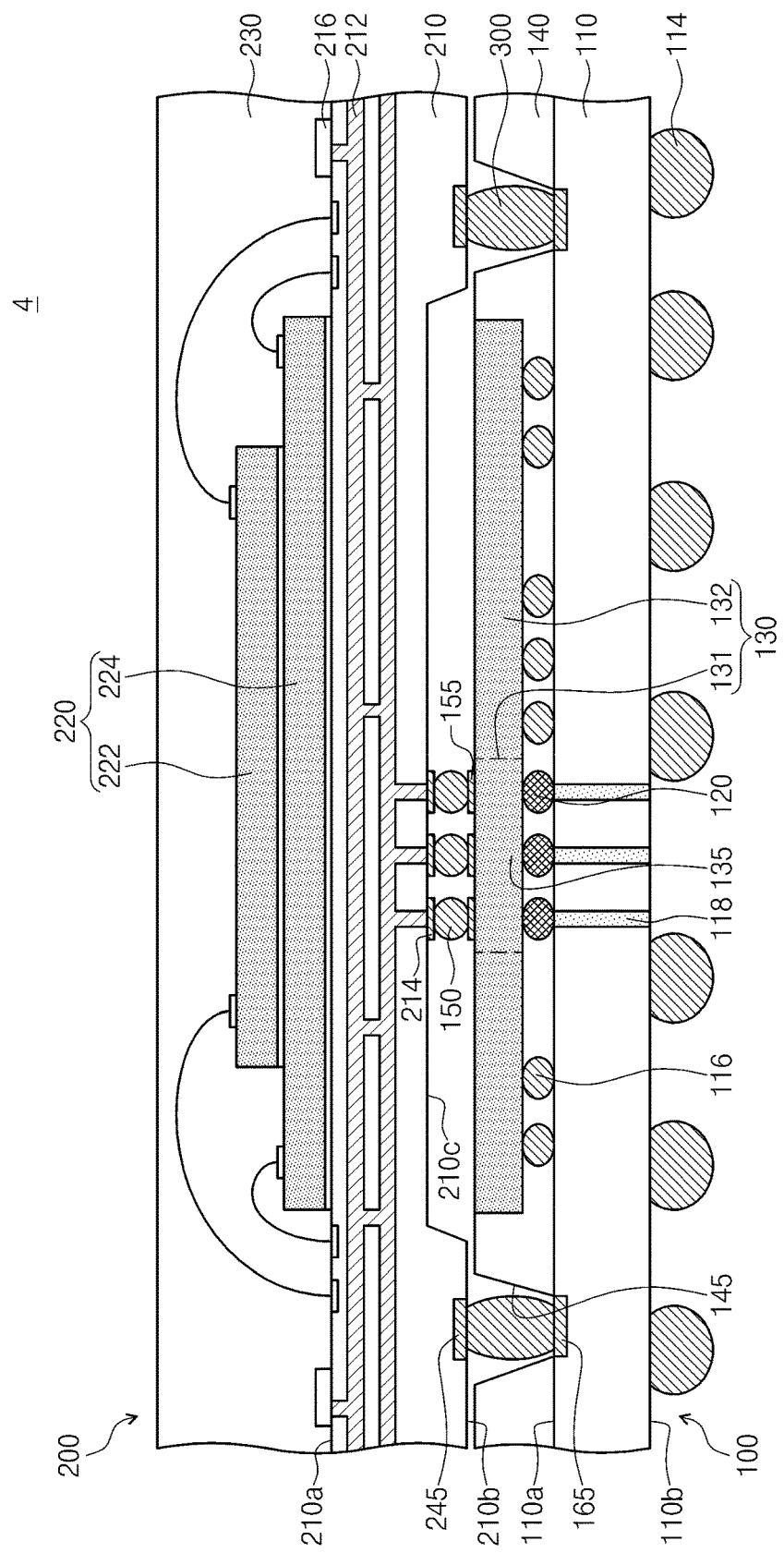
FIG. 5 is a sectional view of another semiconductor package according to certain exemplary embodiments of the inventive concept.

FIG. 5 is a sectional view of a semiconductor package according to even other exemplary embodiments of the inventive concept. For convenience in description, the aforesaid technical features may be omitted below.

In the example of FIG. 5, the first connecting portion 150 may be provided on the top surface of the lower package substrate 110, and the second connecting portion 120 may be provided on the bottom surface of the lower package substrate 110. The first connecting portion 150 and the second connecting portion 120 may be formed of or include, for example, at least one of lead (Pb), tin (Sn), silver (Ag), bismuth (Bi), or copper (Cu). The first connecting portion 150 and the second connecting portion 120 may connect to the lower semiconductor chip 130, and in this case, heat generated in the lower semiconductor chip 130 can be dissipated through both of the top and bottom surfaces of the lower semiconductor chip 130. For example, because heat-dissipating terminals contact the lower semiconductor chip 130, even without heat-conducting vias as in the other examples, heat generated by the lower semiconductor chip 130 can be dissipated through the heat-dissipating terminals disposed thereabove and therebelow. Alternatively, the first connecting portion 150 and the second connecting portion 120 may be provided in the form of a pad. Heat generated in the lower semiconductor chip 130 can be dissipated to the outside through top and bottom surfaces of the lower semiconductor chip 130, and this makes it possible to improve a heat dissipation property of the semiconductor package. Further, since the first connecting portion 150, the upper heat-dissipation pattern 212, the first heat-dissipation pad 216, the second connecting portion 120, and the second via 118 are formed of heat-conducting materials such as metal materials, generated heat can be easily dissipated. It should be noted that although the various figures depict the first connecting portion 150 connecting to the lower semiconductor chip 130 through terminals 155, these terminals can be omitted such that the first connection portion 150 contacts the lower semiconductor chip 130 and/or heat-conducting vias of the lower semiconductor chip 130.

Figure 6:
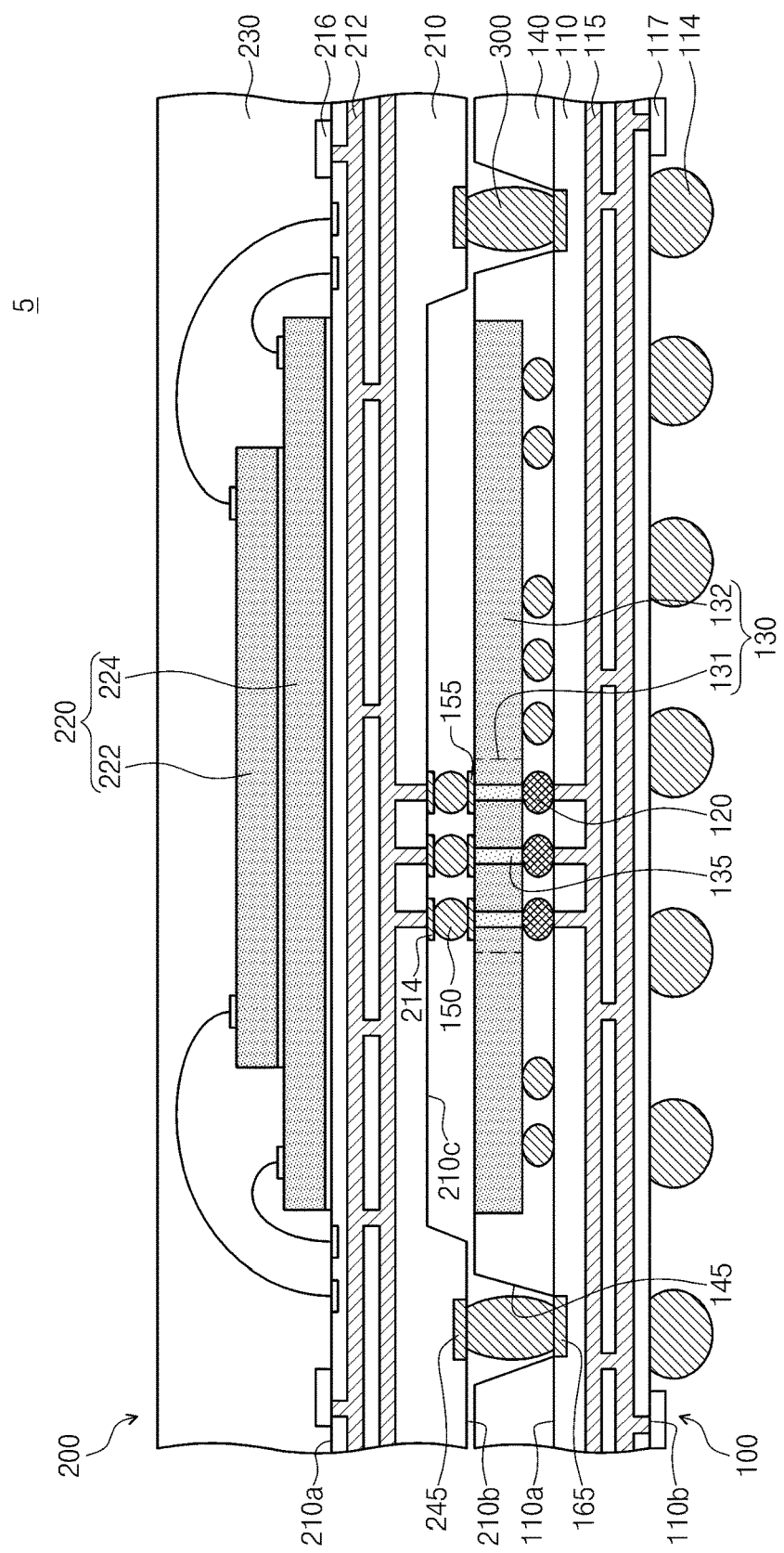
FIG. 6 is a sectional view of another semiconductor package according to certain exemplary embodiments of the inventive concept.

FIG. 6 is a sectional view of a semiconductor package according to yet other exemplary embodiments of the inventive concept. For convenience in description, the aforesaid technical features may be omitted below.

Referring to FIG. 6, a lower heat-dissipation pattern 115 may be provided in the lower package substrate 110. The lower heat-dissipation pattern 115 may be formed, for example, of the same types of materials as the upper heat-dissipation pattern 212, and may have a similar structure. For example, in one embodiment, the lower heat-dissipation pattern 115 may extend horizontally across the lower package substrate 110 to cover an area and/or length greater than that of the lower semiconductor chip 130. For example, it may be formed of one or more layers of heat-conductive material embedded within the lower package substrate 110. Thus, the lower heat-dissipation pattern 212 may be configured to dissipate heat from a center of the package 1 toward sides of the package 1 through one or more horizontally oriented portions.

A second heat-dissipation pad 117 may be provided on the bottom surface 110b of the lower package substrate 110. For example, a plurality of second heat-dissipation pads 117 may be provided on both edge regions of the bottom surface 110b of the lower package substrate 110. Alternatively, the second heat-dissipation pad 117 may be provided on a side surface of the lower package substrate 110. The second heat-dissipation pad 117 may be formed of or include, for example, at least one of lead (Pb), tin (Sn), silver (Ag), bismuth (Bi), or copper (Cu). The lower heat-dissipation pattern 115 may connect the second connecting portion 120 to the second heat-dissipation pad 117. The second connecting portion 120, the lower heat-dissipation pattern 115, and the second heat-dissipation pad 117 may be connected to each other to constitute a thermal pathway for dissipating heat generated in the lower semiconductor chip 130. Heat generated in the lower semiconductor chip 130 can be dissipated to the outside through top and bottom surfaces of the lower semiconductor chip 130, and this makes it possible to improve a heat dissipation property of the semiconductor package. Since the first via 135, the first connecting portion 150, the upper heat-dissipation pattern 212, the first heat-dissipation pad 216, the second connecting portion 120, the lower heat-dissipation pattern 115, and the second heat-dissipation pad 117 are formed of heat-conducting materials, such as metal materials, generated heat can be easily dissipated.

As used here, a "heat-conducting line" may be used to refer generally to one of the heat-conducting materials passing through a semiconductor chip (such as 130) or package substrate (such as 110 or 210) described above. For example, any of the upper heat-dissipation pattern 212, heat-conducting vias 135, heat-conducting vias 118, or lower heat-dissipation pattern 115 may be referred to as heat-conducting lines.

Figure 7:
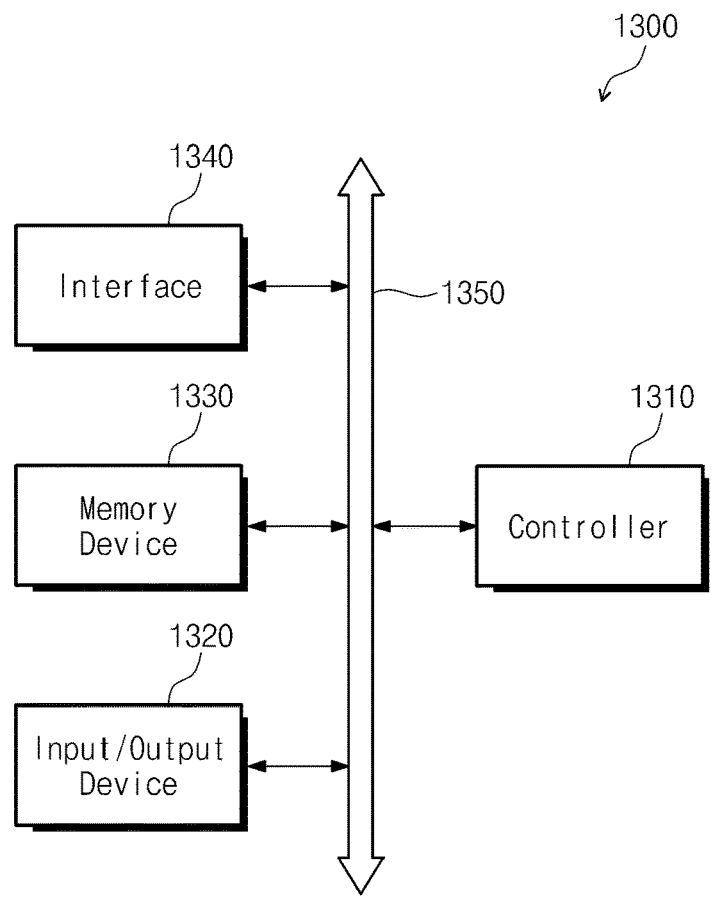
FIG. 7 is a block diagram illustrating an example of electronic systems including a semiconductor package according to example embodiments of the inventive concept.

FIG. 7 is a block diagram illustrating an example of electronic systems including a semiconductor package according to example embodiments of the inventive concept.

The semiconductor package may be applied to an electronic system and may be configured to include a semiconductor memory device. As described herein, various items may be referred to as an electronic device. For example, the semiconductor package may be referred to as an electronic device. Also, the electronic system described herein may be referred to as an electronic device. Referring to FIG. 7, an electronic system 1300 may include a controller 1310, an input/output (I/O) unit 1320, and a memory device 1330. The controller 1310, the I/O unit 1320 and the memory device 1330 may be combined with each other through a data bus 1350. The data bus 1350 may correspond to a path through which electrical signals are transmitted. The controller 1310 may include at least one of a microprocessor, a digital signal processor, a microcontroller or another logic device. The other logic device may have a similar function to any one of the microprocessor, the digital signal processor and the microcontroller. The controller 1310 and the memory device 1330 may include one of the semiconductor packages according to example embodiments such as described above. In some embodiments, the controller 1310 and memory device 1330 may be combined to form one of the semiconductor packages according to the various embodiments described above. The I/O unit 1320 may include, for example, a keypad, a keyboard and/or a display unit. The memory device 1330 may store data and/or commands executed by the controller 1310. The memory device 1330 may include a volatile memory device and/or a non-volatile memory device. For example, the memory device 1330 may include a FLASH memory device. The flash memory device may be realized as solid state disks (SSD). In this case, the electronic system 1300 may stably store mass data to the flash memory system. The electronic system 1300 may further include an interface unit 1340, which transmits electrical data to a communication network or receives electrical data from a communication network. The interface unit 1340 may operate by wireless or cable. For example, the interface unit 1340 may include an antenna for wireless communication or a transceiver for cable communication. Although not shown in the drawings, an application chipset, a camera image processor (CIS), and/or an input/output unit may further be provided in the electronic system 1300.

The electronic system 1300 may be realized as an electronic device such as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1300 performs wireless communication, the electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 8:
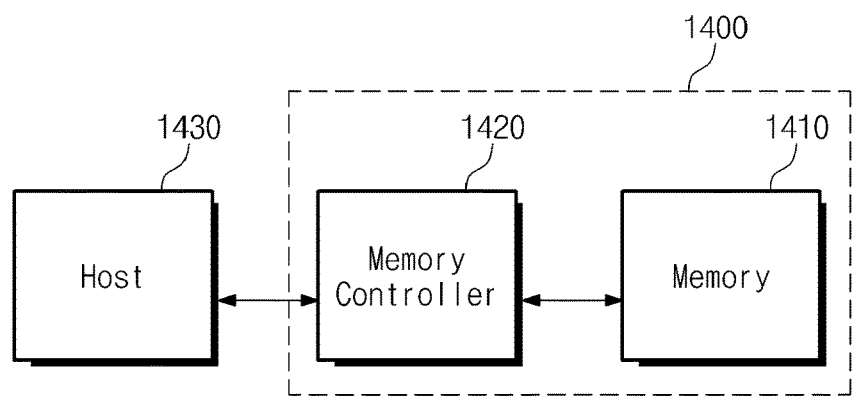
FIG. 8 is a block diagram illustrating an example of memory systems including a semiconductor package according to example embodiments of the inventive concept.

FIG. 8 is a block diagram illustrating an example of memory systems including a semiconductor package according to example embodiments of the inventive concept.

The semiconductor package may be provided in the form of an electronic device such as a memory card. Referring to FIG. 8, a memory system 1400 may include a memory device such as a non-volatile memory device 1410 (e.g., a FLASH memory device) and a memory controller 1420. The non-volatile memory device 1410 and the memory controller 1420 may store data or read stored data. The combination of the non-volatile memory device 1410 and the memory controller 1420 may include at least one of the semiconductor packages according to example embodiments described above. In certain embodiments, the non-volatile memory device 1410 may be in the form of one of the semiconductor packages according to the example embodiments described above. The memory controller 1420 may control the non-volatile memory device 1410 in order to read the stored data and/or to store data in response to read/write request of a host 1430.

According to example embodiments of the inventive concept, a heat-conducting via may be provided to dissipate heat generated in a lower semiconductor chip of a package-on-package device, and this makes it possible to improve a thermal property of a semiconductor package.

According to example embodiments of the inventive concept, heat generated in the lower semiconductor chip can be dissipated to the outside through an upper heat-dissipation pattern of an upper package substrate and a lower heat-dissipation pattern of a lower package substrate.

According to example embodiments of the inventive concept, heat generated in the lower semiconductor chip can be dissipated to the outside through the heat-conducting via provided in the lower package substrate.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
a lower semiconductor package including a lower package substrate and at least a first lower semiconductor chip mounted thereon;
an upper semiconductor package provided on the lower semiconductor package and including an upper package substrate and at least a first upper semiconductor chip mounted thereon; and
a solder bump provided between the upper package substrate and the lower package substrate adjacent to a sidewall of the first lower semiconductor chip to connect the lower semiconductor package and the upper semiconductor package,
wherein the upper package substrate comprises an upper heat-dissipation pattern not electrically connected to any circuitry for transmitting signals to, from, or through the first lower semiconductor chip or the upper package substrate, and
wherein the first lower semiconductor chip comprises at least a first lower heat-conducting via connected to the upper heat-dissipation pattern through the first lower semiconductor chip, the first lower heat-conducting via providing a pathway for dissipating heat generated in the first lower semiconductor chip.

2. The semiconductor package of claim 1, wherein the first lower heat-conducting via is formed of a metal and is electrically insulated from circuitry of the first lower semiconductor chip.

3. The semiconductor package of claim 2, further comprising a first heat-connecting portion provided between the upper package substrate and the first lower semiconductor chip to connect the first lower heat-conducting via to the upper heat-dissipation pattern.

4. The semiconductor package of claim 3, wherein the upper package substrate has a bottom surface facing the lower package substrate and a top surface opposite to the bottom surface, and
the semiconductor package further comprises a metal pattern provided on the bottom surface of the upper package substrate to connect the upper heat-dissipation pattern to the first heat-connecting portion.

5. The semiconductor package of claim 4, wherein the upper package substrate is provided to have a recessed region recessed toward the top surface.

6. The semiconductor package of claim 1, further comprising at least a first heat-dissipation pad provided at an upper surface of the upper package substrate opposite a surface of the upper package substrate facing the first lower semiconductor chip, wherein the upper heat-dissipation pattern is connected to the first heat-dissipation pad.

7. The semiconductor package of claim 1, wherein the first lower semiconductor chip is a logic chip with a logic portion and a memory portion, and
the first lower heat-conducting via and a plurality of additional lower heat-conducting vias are provided in the logic portion of the first lower semiconductor chip.

8. The semiconductor package of claim 1, wherein the lower package substrate comprises:
a top surface facing the upper package substrate and a bottom surface opposite to the top surface; and
a heat-conducting line connected to the first lower heat-conducting via, the heat-conducting line passing through the lower package substrate, and electrically insulated from circuitry of the lower package substrate.

9. The semiconductor package of claim 8, wherein the heat-conducting line comprises one of a plurality of heat-conducting vias passing vertically through the lower package substrate or a lower heat-dissipation pattern passing horizontally through the lower package substrate.

10. The semiconductor package of claim 9, further comprising:
at least a first heat-dissipation pad provided at an upper surface of the upper package substrate opposite a surface of the upper package substrate facing the first lower semiconductor chip,
wherein the upper heat-dissipation pattern is connected to the first heat-dissipation pad; and at least a second heat-dissipation pad provided at a lower surface of the lower package substrate opposite a surface of the lower package substrate facing the first lower semiconductor chip, wherein the first lower heat-conducting via is connected to the lower heat-dissipation pattern and the lower heat-dissipation pattern is connected to the second heat-dissipation pad.

11. The semiconductor package of claim 1, wherein the upper semiconductor package further comprises an upper mold layer covering the upper package substrate and the first upper semiconductor chip, and the lower semiconductor package further comprises a lower mold layer covering the lower package substrate and at least a side surface of the first lower semiconductor chip.

12. The semiconductor package of claim 1 wherein the first lower heat-conducting via and the upper heat-dissipation pattern are each formed of a metal.

13. A package-on-package device comprising:

an upper package including an upper package substrate and at least a first upper semiconductor chip;

a lower package including a lower package substrate and at least a first lower semiconductor chip, wherein the first lower semiconductor chip is positioned between the upper package substrate and the lower package substrate;

at least a first heat-conducting connector connected between the first lower semiconductor chip and the upper package substrate; and a solder bump provided between the upper package substrate and the lower package substrate adjacent to a sidewall of the first lower semiconductor chip to connect the lower package substrate and the upper package substrate, wherein the first lower semiconductor chip includes a first heat-conducting line passing therethrough that is thermally connected to the first heat-conducting connector and is not electrically connected to any circuitry of the first lower semiconductor chip configured to transmit voltage or signals through, from, or for use by the first lower semiconductor chip.

14. The package-on-package device of claim 13, further comprising:

a second heat-conducting line formed in the upper package substrate and thermally connected to the first heat-conducting connector, the second heat-conducting line configured to transmit heat generated at the first lower semiconductor chip toward an outside of the package-on-package device.

15. The package-on-package device of claim 14, wherein:

the first heat-conducting line comprises a first heat-conducting via vertically passing through the first lower semiconductor chip; and the second heat-conducting line comprises a heat-dissipating pattern horizontally passing through the upper package substrate.

16. The package-on-package device of claim 15, further comprising:

a third heat-conducting line formed in the lower package substrate and thermally connected to the first heat-conducting line and configured to transmit heat generated at the first lower semiconductor chip toward an outside of the package-on-package device in a different direction from the second heat-conducting line.

17. The package-on-package device of claim 16, wherein:

the third heat-conducting line includes a second heat-conducting via passing through the lower package substrate, or a heat-dissipating pattern horizontally passing through the lower package substrate.

18. The package-on-package device of claim 14, wherein:

the first heat-conducting line comprises a first heat-conducting via passing through a logic portion of the first lower semiconductor chip.

19. The package-on-package device of claim 14 wherein the first heat-conducting line and the second heat-conducting line are each formed of a metal.

20. An electronic device, comprising:

an upper package including an upper package substrate and at least a first upper semiconductor chip;

a lower package including a lower package substrate and at least a first lower semiconductor chip, wherein the first lower semiconductor chip is positioned between the upper package substrate and the lower package substrate, wherein the first lower semiconductor chip includes a first heat-conducting line passing therethrough, the first heat-conducting line not electrically connected to any circuitry of the first lower semiconductor chip configured to transmit voltage or signals through, from, or for use by the first lower semiconductor chip;

a thermal pathway passing through the upper package substrate and thermally connected to the first heat-conducting line, and configured to transmit heat generated at the first lower semiconductor chip toward an outside of the upper package; and a solder bump provided between the upper package substrate and the lower package substrate adjacent to a sidewall of the first lower semiconductor chip to connect the lower package and the upper package.

* * * * *